United States Patent [19]
Belke, Jr. et al.

[11] Patent Number: 5,738,797
[45] Date of Patent: Apr. 14, 1998

[54] THREE-DIMENSIONAL MULTI-LAYER CIRCUIT STRUCTURE AND METHOD FOR FORMING THE SAME

[75] Inventors: Robert E. Belke, Jr., West Bloomfield; Michael G. Todd, South Lyon; Andrew Z. Glovatsky, Ypsilanti; Alice D. Zitzmann, Dearborn, all of Mich.

[73] Assignee: Ford Global Technologies, Inc., Dearborn, Mich.

[21] Appl. No.: 649,377

[22] Filed: May 17, 1996

[51] Int. Cl.⁶ ............................... B44C 1/22; C23F 1/00
[52] U.S. Cl. .................. 216/16; 216/20; 216/35; 216/52
[58] Field of Search ............................ 216/13, 16, 19, 216/20, 35, 39, 41, 52, 56; 264/104, 272.11, 272.15, 273

[56] References Cited

U.S. PATENT DOCUMENTS

| | | |
|---|---|---|
| 3,801,388 | 4/1974 | Akiyama et al. |
| 4,404,059 | 9/1983 | Livshits et al. |
| 4,710,419 | 12/1987 | Gregory .................... 216/20 X |
| 4,944,908 | 7/1990 | Leveque et al. ............ 216/13 X |
| 5,220,488 | 6/1993 | Denes. |

*Primary Examiner*—William Powell
*Attorney, Agent, or Firm*—Joseph W. Malleck

[57] ABSTRACT

A three dimensional multi-layer circuit structure is formed by partially etching a foil having a coating. A pre-circuit is formed by providing a metal foil, applying a photodefinable photoresist to each side of the metal foil, selectively exposing and developing the photoresist leaving exposed areas and unexposed areas and, plating the unexposed areas with a second metal. The pre-circuit is placed in an etching solution and removed after the etching solution partially etches the metal foil to undercut the second metal. The partially etched pre-circuit is then bent into a predetermined shape. The partially etched pre-circuit is then inserted into a mold cavity so that at least one surface of the circuit structure is adjacent to the mold. The mold is filled with a polymer resin so that the polymer resin encapsulates at least a portion of the partially etched pre-circuit and substantially fills the undercut. The molded circuit structure is then removed from the mold and the metallic foil is further etched to complete the forming of the circuit.

18 Claims, 3 Drawing Sheets

THREE-DIMENSIONAL MULTI-LAYER CIRCUIT STRUCTURE AND METHOD FOR FORMING THE SAME

FIELD OF THE INVENTION

The present invention relates generally to a multi-layer circuit structure, and more specifically to forming a multi-layer circuit structure conforming to a three-dimensional shape.

BACKGROUND OF THE INVENTION

The U.S. Pat. No. 3,801,388 and 4,404,059 teach a method for manufacturing multi-layer circuit structures. The multi-layer circuit structures are etched in the predetermined manner to form air bridges out of the layers of the conductors of the circuit structure. The air bridges form the interconnections of the circuit. One step in the process is mounting a partially etched pre-circuit to a solid planar substrate to support to the conductors before full etching.

One problem with circuits formed by the above methods are that since the circuits are mounted to a planar substrate, use in areas of limited space may be restricted. For example, in the automotive industry circuit structure space behind the instrument panel is a premium. The space behind an instrument panel is also contoured which also does not lend itself to easily incorporating a planar circuit structure to the instrument panel.

Circuit structures formed under an etching process are desirable for many reasons. The etching process is believed to be less expensive than that of conventionally known multi-layer processes. Etching processes eliminate costly, time consuming steps such as plating through holes. Further conventional four layer circuit boards can be converted into two layer structures in a relatively small amount of space.

It would therefore be desirable to employ an etching process for forming non-planar multi-layer circuit structure, so that the circuit structure may be incorporated into compact non-planar spaces.

SUMMARY OF THE INVENTION

The present invention overcomes the disadvantages of the related art by forming a partially etched pre-circuit by providing a metal foil, applying a photodefinable photoresist to each side of the metal foil, selectively exposing and developing the photoresist leaving exposed areas and unexposed areas and applying a second metal to the unexposed areas. The pre-circuit is placed in an etching solution and removed after the etching solution partially etches the metal foil to undercut the second metal. The partially etched pre-circuit is then bent into a predetermined shape. The partially etched pre-circuit is then inserted into a mold cavity so that at lease one surface of the circuit structure is adjacent to the mold. The mold is filled with a dielectric that the dielectric encapsulates at least a portion of the partially etched pre-circuit and substantially fills the undercut. The molded circuit structure is then removed from the mold and the metallic foil is further etched to complete the forming of the circuit.

In one aspect of the invention, the etched circuit structure may be populated with components that are subsequently encapsulated in the resin.

One advantage of the present invention is that since the partially etched pre-circuit is very flexible it may be formed into a variety of shapes before molding.

BRIEF DESCRIPTION OF THE DRAWINGS

These and other objects, advantages, and features of the present invention will be apparent to those skilled in the art upon reading the following description with reference to the accompanying drawings, in which.

DETAILED DESCRIPTION OF THE PREFERRED EMBODIMENT

Figure 1A:
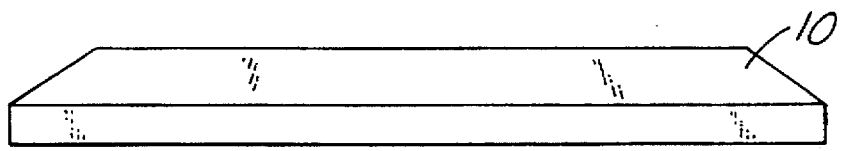
FIGS. 1a through 1h represent the various steps in forming a three-dimensional multi-layer circuit structure according to the present invention.

Referring to FIG. 1a, a base plate 10 is shown. Eventually conductors that comprise the circuit traces are formed on the surfaces of base plate 10. One method for applying conductors to base plate 10 is to apply a conductive metal over the entire surface then selectively remove the unwanted portions.

Figure 1B:
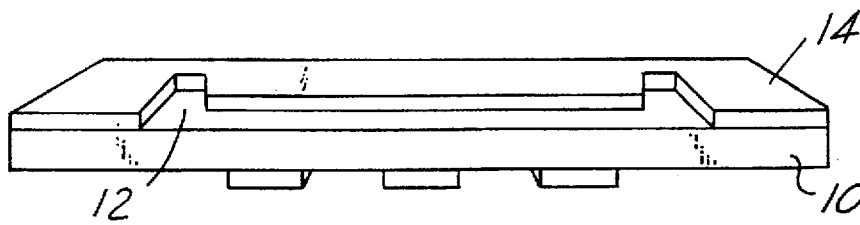
Figure 1C:
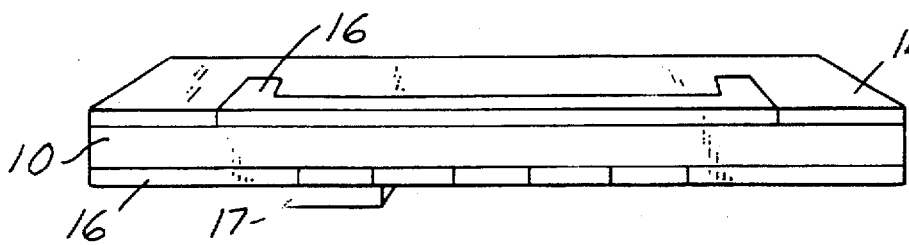

Referring to FIG. 1b, the preferred method for providing conductor is applying a photoimage 14 to each side of base plate 10. Photoimage 14 is developed in a conventional manner leaving blank portions 12. Photoimage 14 consists of a material that will resist adherence of the metal of the conductors. Photolithography is one method of forming photoimage Referring now to FIG. 1c, the conductors 16 are plated onto blank portions 12. Preferably conductors 16 are formed by electroplating. Electroplating places a potential difference between base plate 10 and the metal that becomes the conductor. Blank portions 12 then attract the metal of the conductor.

Various metals may be used for base plate 10 and conductors 16. It is necessary, however, to have the metals react at different rates to etching solutions. For example, base plate 10 may be a copper foil that is 0.006 inches thick. The conductors 16 may be electrolytically plated onto the areas left exposed by photoimage 14. The metal of conductor 16 may be nickel and will form the traces of the circuit.

Figure 1D:
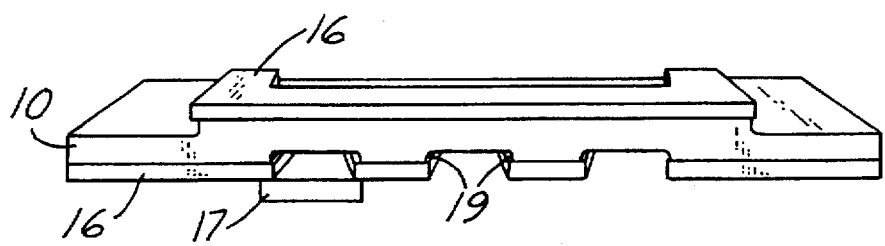

Referring now to FIG. 1d, following the nickel plating, the photoimage 14 is removed. The resist is stripped in a conventional etching process. Base plate 10 is also partially etched so that about 0.001 inches of copper material is removed from each side of base plate 10. An undercut region 19 is formed into the base plate 10 behind conductor 16.

As an optional feature an electrical component 17 such as a resistor, capacitor or inductor may be fastened to conductor 16. Electrical component 17 may be fastened by a conventional soldering method such as reflow soldering.

Figure 1E:
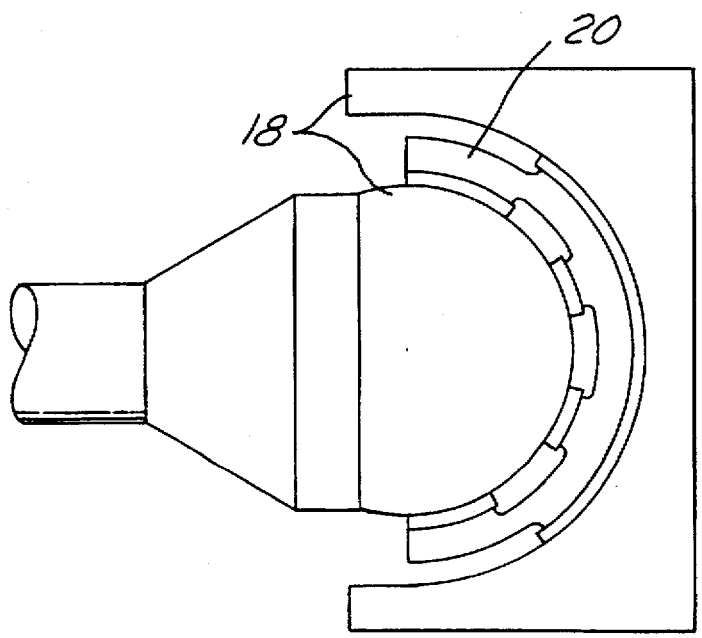

Referring now to FIG. 1e, at this point the pre-etched circuit may be bent by a forming machine 18 that forms the pre-etched circuit 20 to a desired shape. As shown, pre-etched circuit 20 is formed in a cylindrical manner. Forming machine 20 may be a vacuum forming machine, a stamping machine or blanking machine. However, pre-etched circuit 20 may be bent to form right angles. One example is that the circuit may be bent to conform to a vent duct of an instrument panel.

Figure 1F:
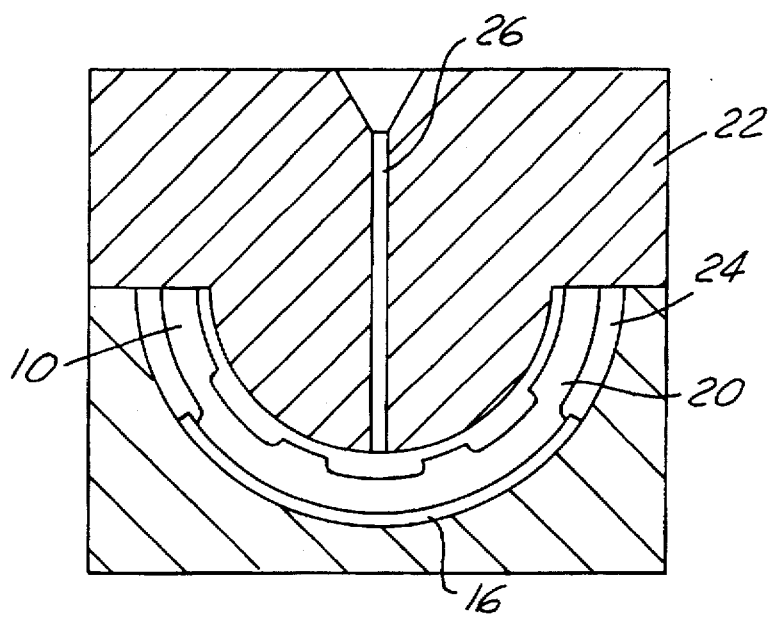

Referring now to FIG. 1f, pre-etched circuit 20 may be placed into a mold 22. It is preferred that the bending steps shown in FIG. 1e, bend the pre-etched circuit 20 to conform substantially to the shape of mold 22. The forming step shown in FIG. 1e is optional if some means is provided within mold 22 to hold the circuit structure in place during the molding process such as pins or clips (not shown). A dielectric such as a polymer resin, not shown, is injected into the mold cavity 24 through gate 26. As the dielectric is forced into mold cavity 24, pre-etched circuit 20 is urged against the face of the mold cavity 24 so that the portion of conductors 16 will be visible when the pre-etched circuit 20 is removed from mold 22. The dielectric flows into undercut region 19 to help maintain adhesion of dielectric to pre-etched circuit.

In the molding process several pre-etched circuits 20 may be molded simultaneously along with any other mechanical components desired. For example, if the molded circuit structure will be used as a part of a module or module cover, vents, fasteners or other structures may be molded along with pre-etched circuit 20.

Before placing the pre-etched circuit 20 the surface of conductors 16 may be treated to increase adherence between conductors 16 and the dielectric. For example if conductors 16 are copper the surface may be oxidized to form "black oxide". Depending on the material of the conductors, the surface treatment will vary.

The dielectric preferably has a comparable coefficient of thermal expansion as that of the metals of the etched circuit. Matching the coefficients of thermal expansion limits stressing the circuit during thermal cycling. If the circuit is stressed too much the circuit traces may become unreliable. Examples of acceptable materials include thermoplastic and thermoset resins such as polypropylene, Noryl, a trademark of GE plastics, nylon and sheet molded composites. A filler such as glass may be placed into the substrate material in sufficient quantity to lower the coefficient of thermal expansion (CTE) to within about 15 ppm/°C. of the higher of the CTE of the conductor or the base plate metals. Copper has a CTE of 17 ppm/°C. and nickel has a CTE of 13 ppm/°C. One example of an acceptable material is 55 percent glass filled polyethyleneterphthatale (PET).

Figure 1G:
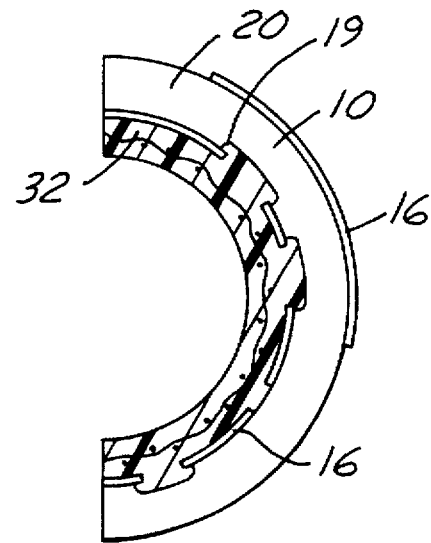

Referring now to FIG. 1g, a stand alone molded pre-etched circuit with a molded dielectric layer 32 is shown. As seated molded dielectric layer may be a housing of a module or a ventilation duct in an automotive vehicle.

Figure 1H:
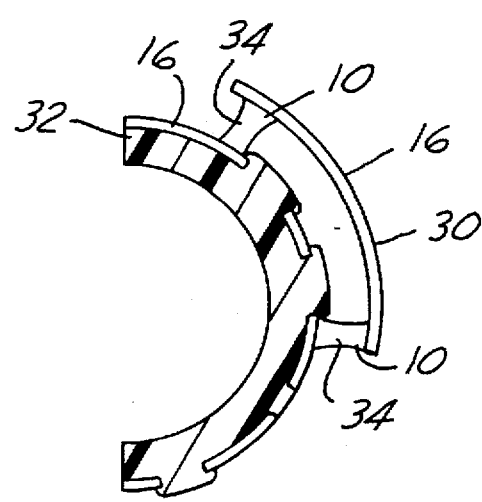

Referring now to FIG. 1h, after removing the pre-etched molded circuit from the mold, the molded circuit is then etched to form air bridges 30. Air bridges 30 are formed when the metal of base plate 10 is etched away under conductors 16 to form pedestals 34. Pedestals 34 support air bridge 30 and act as interconnects between conductors 16.

Figure 2:
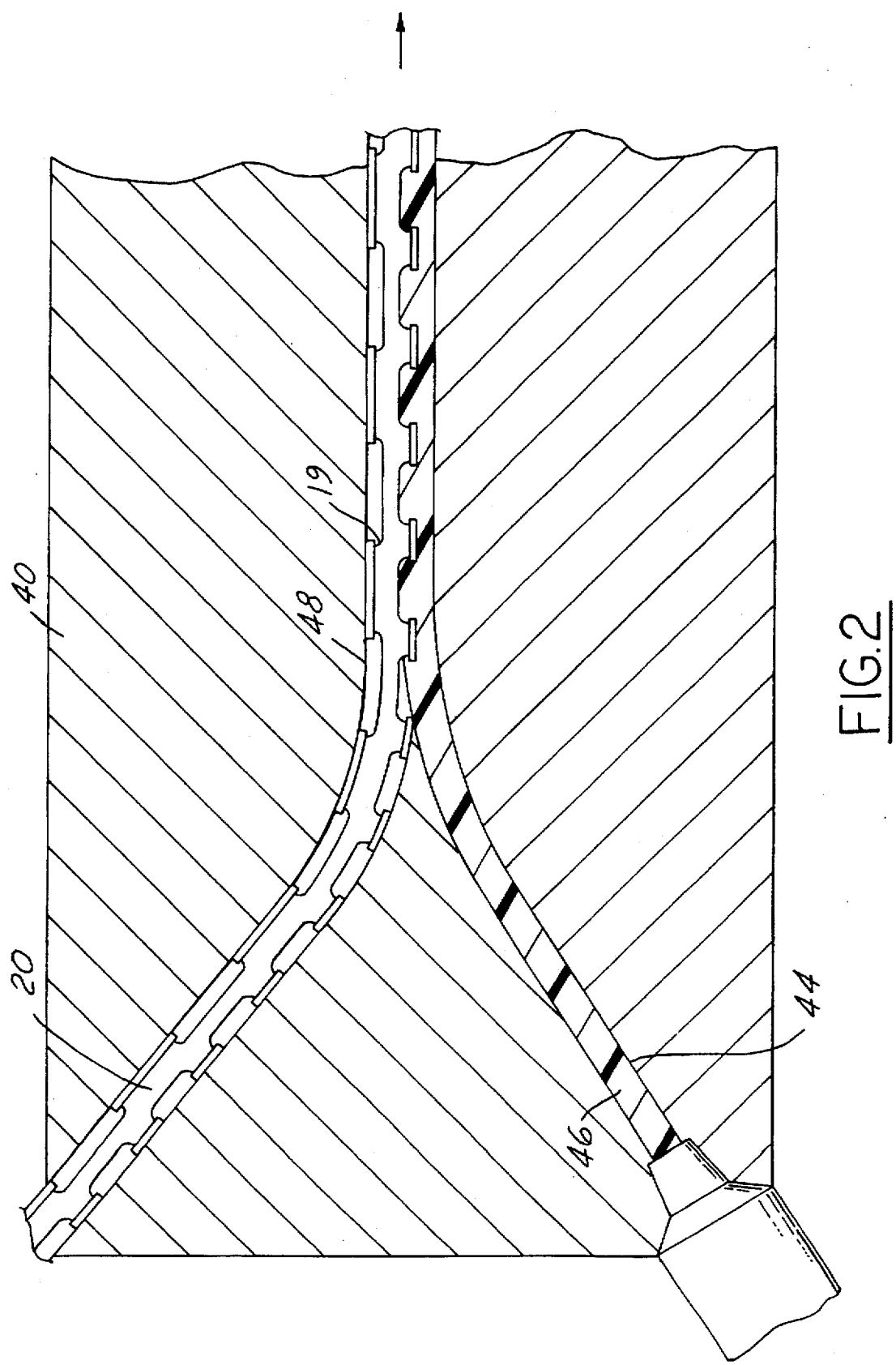
FIG. 2 represents a method for continuously molding the precircuit.

Referring now to FIG. 2, pre-.etched circuit 20 is continuously molded in a continuous mold 40. Pre-etched circuit 20 is fed into a guide die 42. A runner 44 is used to feed a molten dielectric material 46 into a mold cavity 48. When pre-etched circuit 20 meets the molten dielectric 46, molten dielectric flows into undercut region 19. As the circuit with the molded dielectric layer leaves the continuous mold 40, the dielectric material is sufficiently cool to maintain adherence of the dielectric to pre-etched circuit 20. Continuous mold can be used to form the flexible pre-etched circuit into a desired shape.

As would be evident to one skilled in the art, several modifications of the invention may be made while still being within the scope of the appended claims. For example, the materials used for the molding process and for the metallic traces may be changed.

We claim:

1. A method of forming a circuit structure comprising the steps of:
    forming a partially etched pre-circuit by,
        providing a metallic foil formed of a first metal,
        applying a second metal to selected areas of said foil,
        etching said metallic foil in an etching solution, and
        removing said metallic foil from said etching solution after said etching solution partially etches said metallic foil to undercut said second metal;
    bending said partially etched pre-circuit into a shape;
    inserting said partially etched pre-circuit into a mold cavity so that at least one surface of said circuit structure is adjacent said mold;
    filling said mold with a molten dielectric so that said molten dielectric encapsulates at least a portion of said partially etched pre-circuit and fills said undercuts;
    removing said partially etched pre-circuit from said mold; and
    further etching said foil to form air bridges.

2. A method of forming a circuit structure as recited in claim 1 wherein prior to said step of plating comprises:
    applying a resistive material to areas of each side of said metallic foil;
    selectively exposing and developing said photoresist leaving exposed areas on said foil; and
    plating said exposed areas on said foil with a second metal.

3. A method of forming a circuit structure as recited in claim 1 wherein said molten dielectric is ceramic.

4. A method of forming a circuit structure as recited in claim 1 wherein said molten dielectric is a polymer.

5. A method of forming a circuit structure as recited in claim 1 further comprising the step of treating said selected areas with an adhesion treatment after plating to increase adhesion between said selected area and said molten dielectric.

6. A method of forming a circuit structure as recited in claim 5 wherein said adhesion treatment comprises oxidizing said conductor.

7. A method of forming a circuit structure as recited in claim 1 further comprising the step of affixing an electrical component to said second metal prior to the step inserting said partially etched pre-circuit into a mold cavity.

8. A method of forming a circuit structure as recited in claim 1 wherein said step of plating comprises electroplating.

9. A method of forming a circuit structure as recited in claim 1 wherein said dielectric material has a coefficient of thermal expansion comparable to said coefficient of expansion of said partially etched pre-circuit.

10. A method of forming a circuit structure comprising the steps of:
    forming a partially etched pre-circuit by,
        providing a metallic foil formed of a first metal having a first coefficient of thermal expansion,
        applying a second metal having second coefficient of thermal expansion to selected areas of said foil,
        etching said metallic foil in an etching solution, and
        removing said metallic foil from said etching solution after said etching solution partially etches said metallic foil to undercut said second metal;
    bending said partially etched pre-circuit into a shape;
    inserting said partially etched pre-circuit into a mold cavity so that at least one surface of said circuit structure is adjacent said mold;
    filling said mold with a molten dielectric so that said molten dielectric encapsulates at least a portion of said partially etched pre-circuit and fills said undercuts, said dialectic having a third coefficient of thermal expansion within a range of the first and second coefficients of thermal expansion;
    removing said partially etched pre-circuit from said mold; and
    further etching said foil to form air bridges.

11. A method of forming a circuit structure as recited in claim 10 wherein prior to said step of plating comprises:

applying a resistive material to areas of each side of said metallic foil;

selectively exposing and developing said photoresist leaving exposed areas on said foil; and plating said exposed areas on said foil with a second metal.

12. A method of forming a circuit structure as recited in claim 10 wherein said molten dielectric is ceramic.

13. A method of forming a circuit structure as recited in claim 10 wherein said molten dielectric is a polymer.

14. A method of forming a circuit structure as recited in claim 10 further comprising the step of treating said selected areas with an adhesion treatment after plating to increase adhesion between said selected area and said molten dielectric.

15. A method of forming a circuit structure as recited in claim 14 wherein said adhesion treatment comprises oxidizing said conductor.

16. A method of forming a circuit structure as recited in claim 10 further comprising the step of affixing an electrical component to said second metal prior to the step inserting said partially etched pre-circuit into a mold cavity.

17. A method of foxing a circuit structure as recited in claim 10 wherein said range is within about 30 ppm/°C.

18. A method of forming a circuit structure as recited in claim 10 wherein said first metal comprises copper and said second metal comprises nickel.

* * * * *